(12) United States Patent
Nakamiya et al.

(10) Patent No.: US 11,924,958 B2
(45) Date of Patent: Mar. 5, 2024

(54) FLEXIBLE PRINTED CIRCUIT COPPER OVERLAY FOR TEMPERATURE MANAGEMENT

(71) Applicant: Western Digital Technologies, Inc., San Jose, CA (US)

(72) Inventors: Teruhiro Nakamiya, Setagaya-ku (JP); Kazuhiro Nagaoka, Fujisawa (JP); Satoshi Nakamura, Yokohama (JP); Nobuyuki Okunaga, Kawasaki (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/195,375

(22) Filed: May 10, 2023

(65) Prior Publication Data

US 2023/0276566 A1    Aug. 31, 2023

Related U.S. Application Data

(63) Continuation-in-part of application No. 17/356,406, filed on Jun. 23, 2021, now abandoned.

(51) Int. Cl.
*G11B 5/48* (2006.01)
*H05K 1/02* (2006.01)
(Continued)

(52) U.S. Cl.
CPC ........... *H05K 1/0201* (2013.01); *H05K 1/028* (2013.01); *H05K 1/115* (2013.01); *H05K 3/10* (2013.01);
(Continued)

(58) Field of Classification Search
None
See application file for complete search history.

(56) References Cited

U.S. PATENT DOCUMENTS 5,737,152 A  *  4/1998  Balakrishnan ....... G11B 5/4853
6,728,071 B2      4/2004  Shimizu
(Continued)

FOREIGN PATENT DOCUMENTS

CN      206332909 U    7/2017
JP      H11120715 A    4/1994
(Continued)

OTHER PUBLICATIONS

Kynix Semiconductor Limited, Structures and Applications of the FPCB, 12 pages, downloaded from http://www.kynixsemiconductor.com/News/71.html, as early as Apr. 19, 2021.

Primary Examiner — William J Klimowicz
(74) Attorney, Agent, or Firm — John D. Henkhaus (57) ABSTRACT

A hard disk drive flexible printed circuit (FPC) includes a plurality of fingers extending from a main portion, with each finger having a first wiring layer including a first electrically conductive trace layout, a second wiring layer including a second electrically conductive trace layout, and a base film interposed between the first and second wiring layers, where the first conductive trace layout includes at least one thermally conductive protective island overlaying a respective portion of the second trace layout to provide a protective thermal barrier to the base film. Hence, maximum temperatures across various layers of the FPC laminate can be reduced, damage to the FPC prevented, and manufacturing yields improved.

20 Claims, 8 Drawing Sheets

(51) Int. Cl.
*H05K 1/11* (2006.01)
*H05K 3/10* (2006.01)

(52) U.S. Cl.
CPC .............. *H05K 2201/09081* (2013.01); *H05K 2201/10159* (2013.01)

(56) References Cited

U.S. PATENT DOCUMENTS

| | | | |
|---|---|---|---|
| 7,525,767 | B2 | 4/2009 | Erpelding |
| 8,295,013 | B1 | 10/2012 | Pan et al. |
| 8,295,014 | B1 | 10/2012 | Teo et al. |
| 8,320,084 | B1 * | 11/2012 | Shum .................. G11B 5/4833 360/245.9 |
| 8,325,446 | B1 | 12/2012 | Liu et al. |
| 8,477,459 | B1 | 7/2013 | Pan |
| 8,665,566 | B1 | 3/2014 | Pan et al. |
| 8,760,812 | B1 | 6/2014 | Chen et al. |
| 8,934,199 | B1 | 1/2015 | Pan |
| 9,105,288 | B1 | 8/2015 | Hahn et al. |
| 9,236,070 | B1 | 1/2016 | Cayaban |
| 9,972,347 | B1 | 5/2018 | Pan et al. |
| 11,430,474 | B1 * | 8/2022 | Nakamiya ............ G11B 5/4826 |
| 2012/0099221 | A1 | 4/2012 | Ho et al. |
| 2015/0124352 | A1 | 5/2015 | Rothenberg et al. |
| 2015/0162034 | A1 | 6/2015 | Chen et al. |
| 2015/0356986 | A1 | 12/2015 | Pan |
| 2016/0086624 | A1 | 3/2016 | Pan et al. |
| 2022/0418092 | A1 * | 12/2022 | Kishimoto ............. H05K 1/028 |

FOREIGN PATENT DOCUMENTS

| | | |
|---|---|---|
| JP | 2004273968 A | 9/2004 |
| JP | 2009080894 A | 4/2009 |
| JP | 2010146653 A | 7/2010 |
| JP | 2020155542 A | 9/2020 |
| JP | 2021048272 A | 3/2021 |

* cited by examiner

FLEXIBLE PRINTED CIRCUIT COPPER OVERLAY FOR TEMPERATURE MANAGEMENT

FIELD OF EMBODIMENTS

Embodiments of the invention may relate generally to hard disk drives, and particularly to approaches to managing the temperature across a flexible printed circuit (FPC) during interconnecting procedure.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

To write data to the medium, or to read data from the medium, the head has to receive instructions from a controller. Hence, the head is connected to the controller in some electrical manner so that not only does the head receive instructions to read/write data, but the head can also send information back to the controller regarding the data read and/or written. Typically, a flexible printed circuit (FPC) laminate is used to electrically transmit signals from the read-write head via a suspension tail to other electronics within an HDD. The FPC and the suspension tail are typically soldered together at a comb or "E-block" portion (see, e.g., carriage 134 of FIG. 1) of a head-stack assembly (HSA). To connect them with solder, the suspension electrical pads and the FPC electrical pads are heated. If the soldering temperature is low the solder may not melt, whereas if the soldering temperature is high these components may be damaged by the heat. For example, one or more layers constituent to the FPC laminate may delaminate or bubble in response to the heat generated by the soldering procedure. Thus, it is desirable to not overheat the FPC during the electrical interconnection procedure, otherwise the FPC may be compromised and the corresponding production yields reduced.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to providing substantially uniform temperature across a flexible printed circuit (FPC) during an interconnecting procedure, are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

At a distal end of the suspension, there is a read-write transducer (or "head") to read and write data. At the other proximal end of the suspension, there are electrically conductive pads (or simply "electrical pads") to electrically connect to corresponding electrically conductive pads on a flexible printed circuit (FPC). The suspension pads and the FPC pads are electrically interconnected (orthogonally in this instance), typically with solder, using a solder reflow, hot air, or a laser may be used to heat the materials in the bonding procedure.

Figure 1:
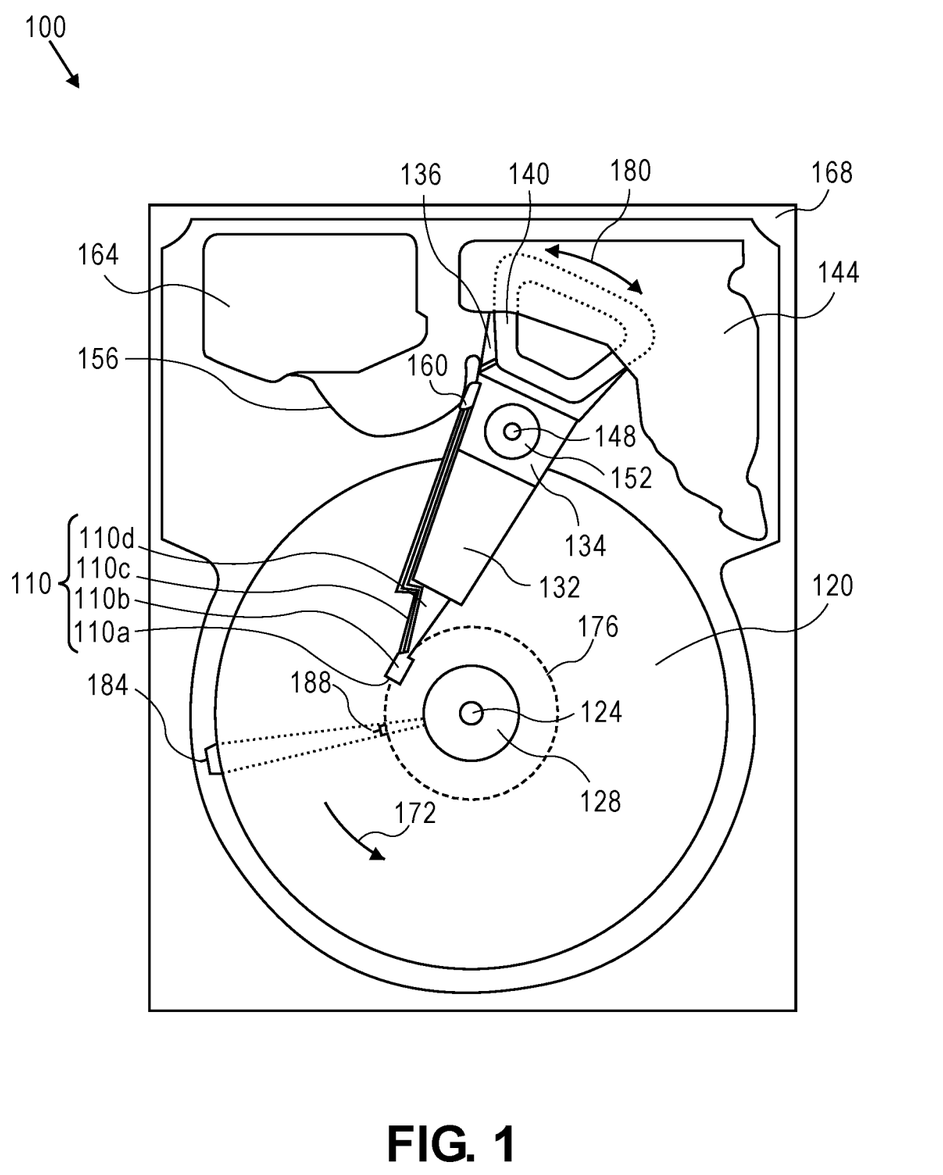
FIG. 1 is a plan view illustrating a hard disk drive, according to an embodiment.
Figure 2A:
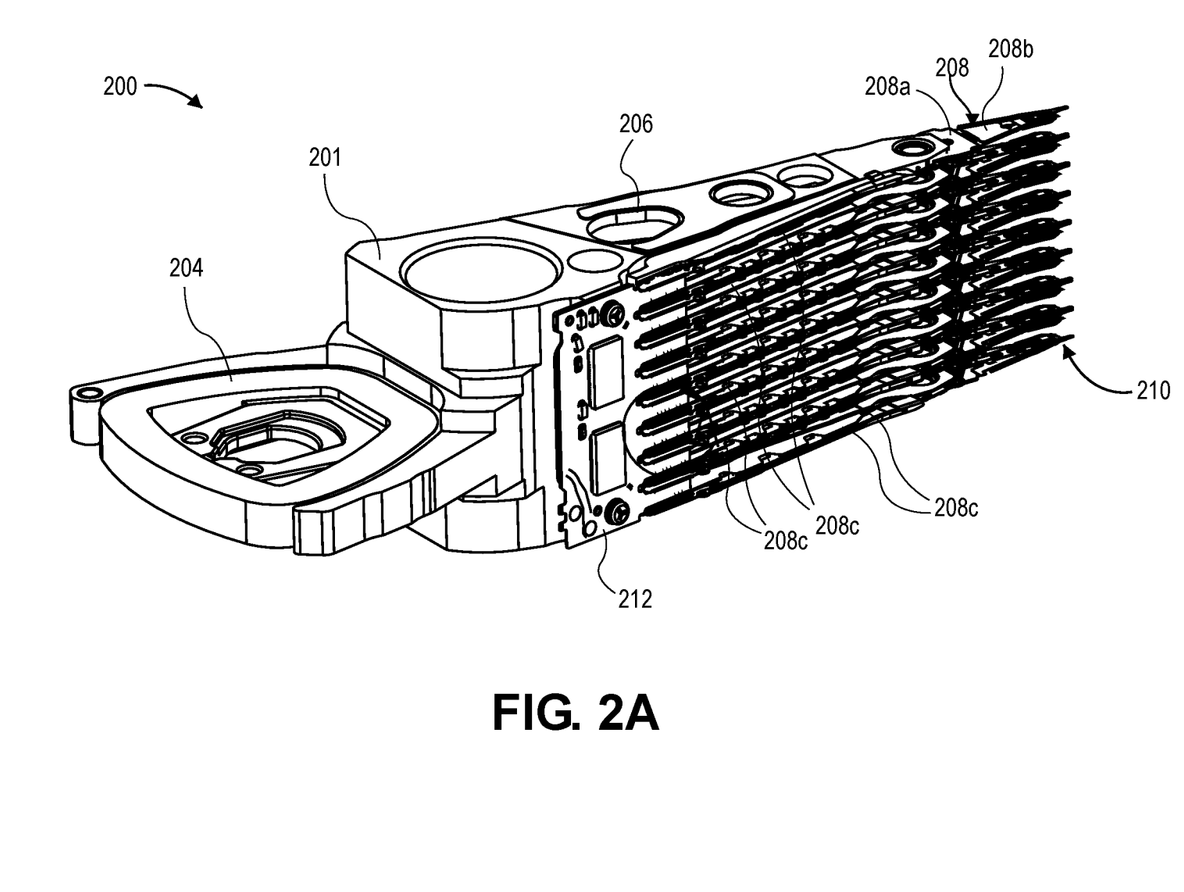
FIG. 2A is a perspective view illustrating an actuator assembly, according to an embodiment.

FIG. 2A is a perspective view illustrating an actuator assembly, according to an embodiment. Actuator assembly 200 comprises a carriage 201 (see, e.g., carriage 134 of FIG. 1) rotatably coupled with a central pivot shaft (not shown here; see, e.g., pivot shaft 148 of FIG. 1) by way of a pivot bearing assembly (not shown here; see, e.g., pivot bearing assembly 152 of FIG. 1), and rotationally driven by a voice coil motor (VCM), of which a voice coil 204 is illustrated here. Actuator assembly 200 further comprises one or more actuator arm 206 (see, e.g., arm 132 of FIG. 1), to each of which is coupled a suspension assembly 208 (see, e.g., lead suspension 110c of FIG. 1) housing a read-write head 210 (see, e.g., read-write head 110a of FIG. 1), and typically comprising a swaged baseplate 208a, a load beam 208b (see, e.g., load beam 110d of FIG. 1), and a suspension tail 208c. Each suspension assembly 208 is electrically connected with a flexible printed circuit (FPC) 212 coupled with the carriage 201, by way of suspension tail 208c.

Figure 2B:
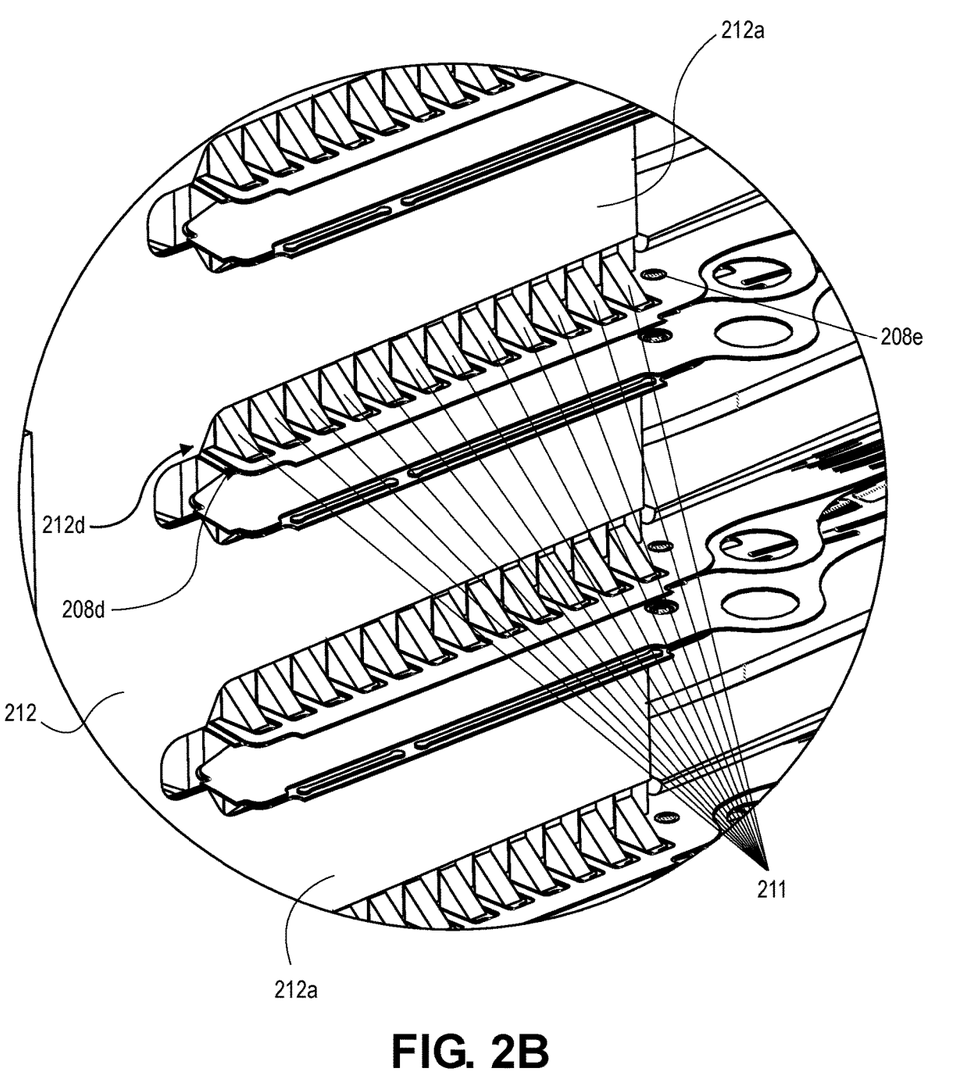
FIG. 2B is a perspective view illustrating an electrical interconnection between a suspension tail and a flexible printed circuit (FPC), according to an embodiment.

FIG. 2B is a perspective view illustrating an electrical interconnection between a suspension tail and a flexible printed circuit (FPC), according to an embodiment. FIG. 2B depicts a suspension tail tip 208e of the suspension tail 208c (FIG. 2A) mechanically and electrically coupled to a corresponding FPC finger 212a of the FPC 212, by way of solder 211 (or some other electrical connection means). Particularly, electrical pads 208d on the suspension tail tip 208e are electrically connected to electrical pads 212d of the FPC 212. Recall that with soldering and other similar connection techniques, the suspension electrical pads and the FPC electrical pads are heated, and if the soldering temperature is too low then the solder may not melt and if the soldering temperature is too high then the FPC may be damaged by the heat. In the worst case, a bubble may be caused on the FPC. That is, one or more layers constituent to the FPC laminate may delaminate in response to the heat generated by the soldering/interconnection procedure. For example, delamination may occur between one or more wiring layers and adjacent insulating film layers, such as by a failure of a corresponding adhesive layer. Thus, it is desirable to heat the FPC uniformly to avoid generating excessive heat that may damage the FPC.

Figure 2C:
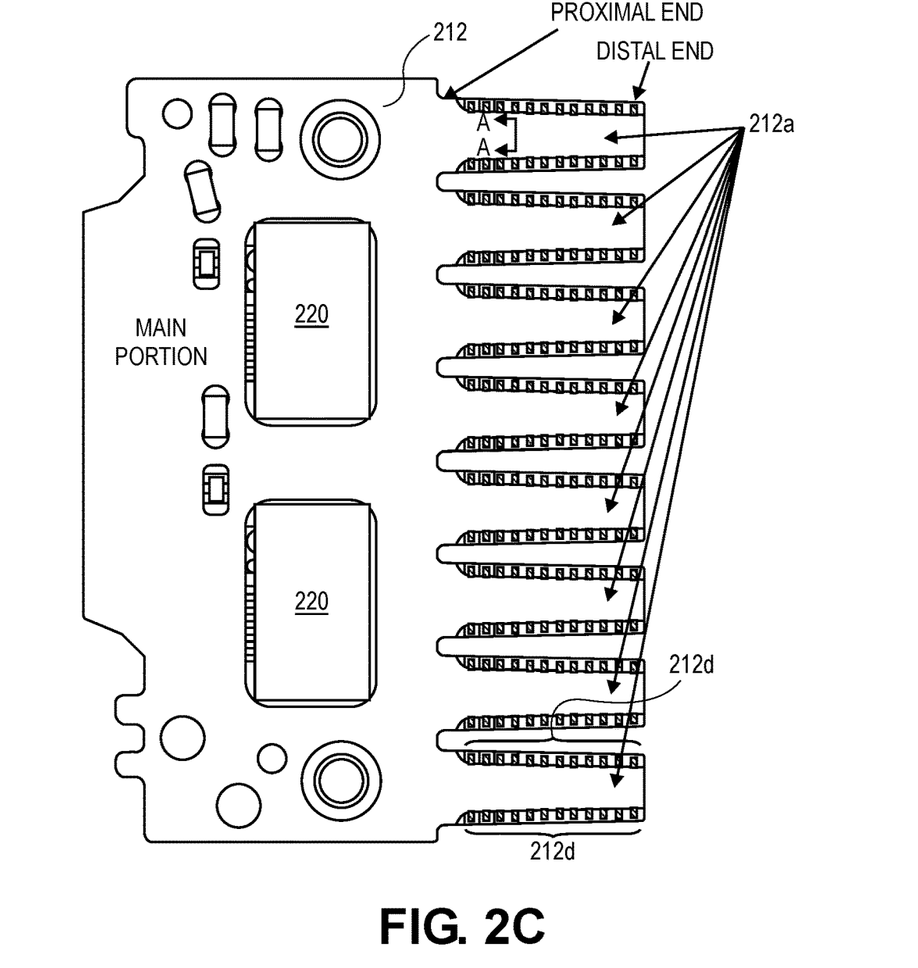
FIG. 2C is a plan view illustrating an FPC, according to an embodiment.

FIG. 2C is a plan view illustrating a flexible printed circuit, according to an embodiment. Here, FPC 212 comprises a plurality of FPC fingers 212a, each comprising a plurality of electrical pads 212d on each of the upper side and the lower side. Each FPC finger 212a typically services both an UP head (a read-write head facing upwards to service a bottom surface of a corresponding disk) and a DN head (a read-write head facing downwards to service a top surface of the same disk), electrically connecting each corresponding UP suspension and DN suspension to a preamp 220 (or beyond) mounted on the FPC 212. A cross-section of a FPC finger 212a is labeled A-A.

Figure 2D:
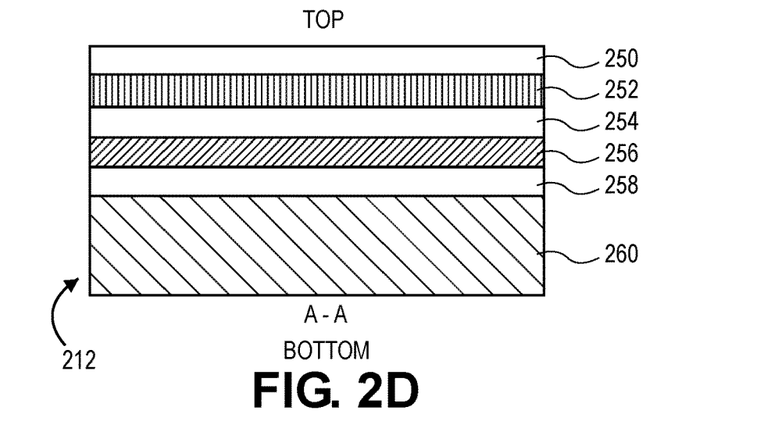
FIG. 2D is a cross-sectional view illustrating the FPC of FIG. 2C, according to an embodiment.

FIG. 2D is a cross-sectional view illustrating the FPC of FIG. 2C, according to an embodiment. Cross-sectional view A-A depicts the layers of an FPC such as FPC 212, comprising a base film 254 (e.g., a polyimide insulating layer) interposed between a top first wiring layer 252 (e.g., comprising copper traces) and a bottom second wiring layer 256 (e.g., comprising copper traces), whereby each of the first and second wiring layers 252, 256 may be used for both the UP and DN heads, and which may vary from implementation to implementation. The first wiring layer 252 is covered by a first cover film 250 (e.g., a polyimide insulating layer) and the second wiring layer 256 is covered by a second cover film 258 (e.g., a polyimide insulating layer). These wiring layers 252, 256 may be electrically connected through one or more via. Furthermore, there are typically adhesive layers between each of the wiring layers 252, 256 and adjacent film layers 250 254, 258. Finally, all of the foregoing layers are coupled with and supported by a bottom stiffener layer 260 (e.g., comprising aluminum, or some other stiff and durable material). The precise layout of FPC 212 may vary from implementation to implementation, so the layout of FIG. 2D is presented as one example. However, the techniques described herein are widely applicable to alternative FPC layouts.

Overlaid Copper for Heat Management of Flexible Printed Circuit Finger

Figure 3A:
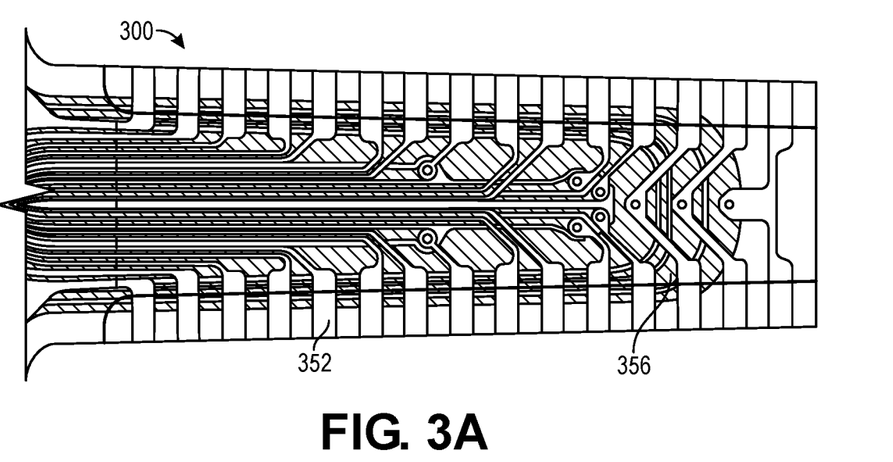
FIG. 3A is a plan view illustrating an FPC finger, according to an embodiment.

FIG. 3A is a plan view illustrating an FPC finger, according to an embodiment. Here, the white area/pattern of FPC 300 represents an upper first wiring layer 352 (similar in layout to first wiring (e.g., copper) layer 252 of FIG. 2D) and the cross-hatched area/pattern represents a lower second wiring (e.g., copper) layer 356 (similar in layout to second wiring layer 256 of FIG. 2D). To keep the temperature of FPC 300 relatively low, it is effective to generally make the area of copper relatively small because copper absorbs heat. FIG. 3A shows a relatively larger second wiring layer 356 compared to a relatively smaller first wiring layer 352. When these wiring layers 352, 356 are heated the larger second wiring layer 356 would become hotter. Therefore, a relatively smaller second wiring layer 356 would be better with respect to heat absorption. However, it may not be feasible to minimize the second wiring layer 356 area beyond a certain point and still attain its intended purpose.

Figure 3B:
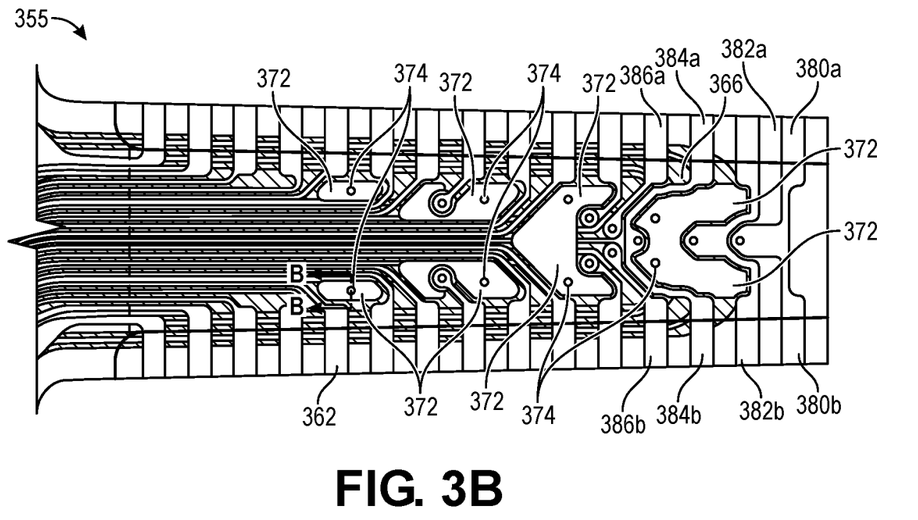
FIG. 3B is a plan view illustrating an overlaid FPC finger, according to an embodiment.
Figure 3C:
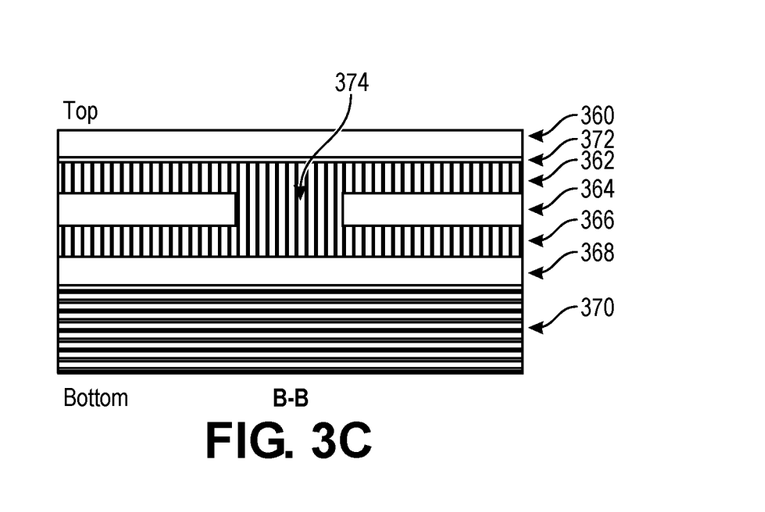
FIG. 3C is a cross-sectional view illustrating the FPC of FIG. 3B, according to an embodiment.

FIG. 3B is a front view illustrating an overlaid FPC finger, and FIG. 3C is a cross-sectional view illustrating the FPC of FIG. 3B, both according to an embodiment. A cross-section of a portion of FPC 355 having a via 374 is labeled B-B in FIG. 3B, with reference to the cross-section B-B of FIG. 3C, depicting the FPC laminate composition of a bottom stiffener layer 370, second cover film 368 (e.g., a polyimide insulating layer), second wiring layer 366, base film 364 (e.g., a polyimide insulating layer), first wiring layer 362 connected to second wiring layer 366 by via 374, and cover film 360 (e.g., a polyimide insulating layer). Here, thermally-conductive protective islands 372 (e.g., copper) are added to the first wiring layer 362 to overlay portions of the second wiring layer 366, to provide a thermal barrier to and thus to protect the second wiring layer 366 as well as the other layers (e.g., base film 364, second cover film 368) surrounding the second wiring layer 366 from excessive heat. Again, the white area/pattern of FPC 355 represents the upper or first wiring layer 362 (similar in layout to first wiring layer 252 of FIG. 2D) and the cross-hatched area/pattern represents the lower or second wiring layer 366 (similar in layout to second wiring layer 256 of FIG. 2D). FIG. 3B shows multiple thermally-conductive protective islands 372 constituent to the first wiring layer 362 and positioned to protectively overlay or cover portions of the second wiring layer 366. Preferably each protective island 372 of the first wiring layer 362 is thermally connected to the second wiring layer 366 by way of a respective via 374. This connection prevents the buildup of excessive heat within the protective islands 372, which could otherwise damage other layers (e.g., first cover film 360, base film 364, second cover film 368).

Note that, due to their function and/or to the respective signals to which each corresponds, some of the pairs of upper electrical pads and lower electrical pads of FPC 355 are electrically connected to each other. As such, upper pad 380a is connected to lower pad 380b, upper pad 382a is connected to lower pad 382b, upper pad 384a is connected to lower pad 384b, and upper pad 386a is connected to lower pad 386b. Thus, one might consider connecting pads 384a and 384b through the adjacent protective island 372. However, this has shown to generate too low of a pad 384a, 384b temperature for a proper solder connection because of the large area of the adjacent protective island and the heat that it absorbs. The embodiment of FIG. 4 can address this issue.

Figure 4:
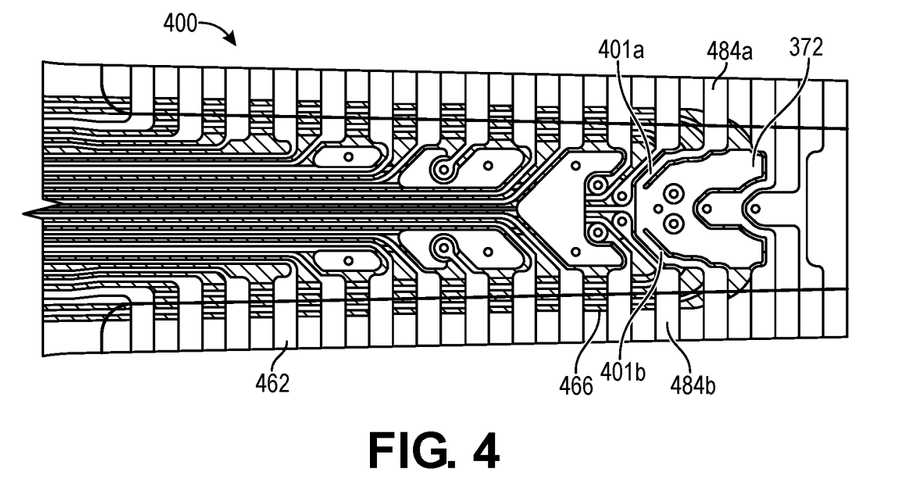
FIG. 4 is a plan view illustrating an overlaid FPC finger, according to an embodiment.

FIG. 4 is a plan view illustrating an overlaid FPC finger, according to an embodiment. Here again, thermally-conductive protective islands 372 (e.g., as with FPC 355 of FIG. 3B) are added to the first wiring layer 462 to overlay portions of the second wiring layer 466, to provide a thermal barrier to and to protect the second wiring layer 466 as well as the other layers from excessive heat. Again, the white area/pattern of FPC 400 represents the first wiring layer 462 (similar in layout to first wiring layer 362 of FIGS. 3B, 3C) and the cross-hatched area/pattern represents the second wiring layer 466 (similar in layout to second wiring layer 366 of FIGS. 3B, 3C). FIG. 4 shows a narrow wiring trace 401a electrically connecting upper pad 484a with the protective island 372 and a similar narrow wiring trace 401b electrically connecting lower pad 484b with the same protective island 372. These wiring traces 401a, 401b are utilized to increase the heat resistance compared to connecting pads 484a and 484b more directly through the adjacent protective island 372, and to thus allow for the generation of enough heat to each pad 484a, 484b for a proper solder connection. According to an embodiment, "narrow" is characterized here as each wiring trace 401a, 401b having a width equal to or less than one fifth (⅕) of the width of the corresponding upper and lower pads 484a, 484b. Thus, for a non-limiting example, each of the wiring traces 401a, 401b may have an approximate width of 30 µm or less relative to each of the upper and lower pads 484a, 484b having an approximate width of 150 µm.

Figure 5:
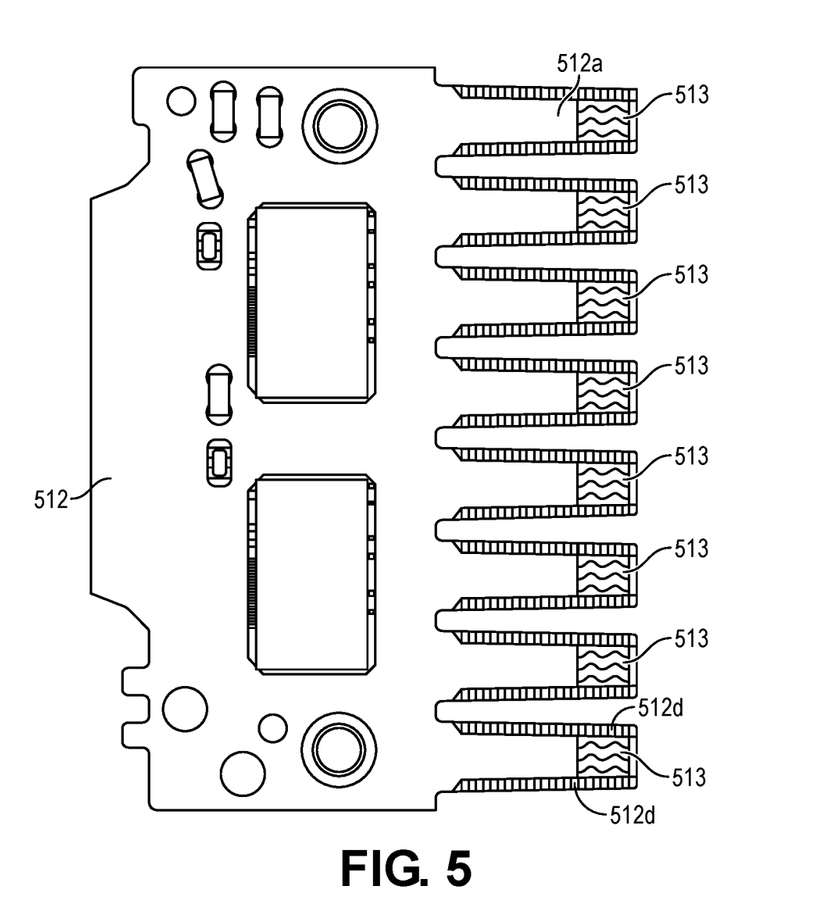
FIG. 5 is a plan view illustrating a flexible printed circuit (FPC), according to an embodiment.

FIG. 5 is a plan view illustrating a flexible printed circuit (FPC), according to an embodiment. FPC 512 comprises a plurality of FPC fingers 512a, each comprising a plurality of electrical pads 512d on each of the upper side and the lower side. Here, because a colored cover film (e.g., white) would reflect more light and more heat than a typically transparent cover film, at least a portion 513 of the cover film (similar in layout to cover film 250 of FIG. 2D, or cover film 360 of FIG. 3C) is constructed of a colored material. According to an embodiment, the colored portion 513 of the cover film is white.

Summarily, the foregoing embodiments each characterizes an approach to managing the temperatures across a flexible printed circuit, such as during an electrical pad interconnection procedure (e.g., soldering), employing the various described techniques alone or in combination. Hence, maximum temperatures across various layers of the FPC laminate can be reduced, damage to the FPC prevented, and manufacturing yields improved.

Method for Manufacturing a Flexible Printed Circuit

Figure 6:
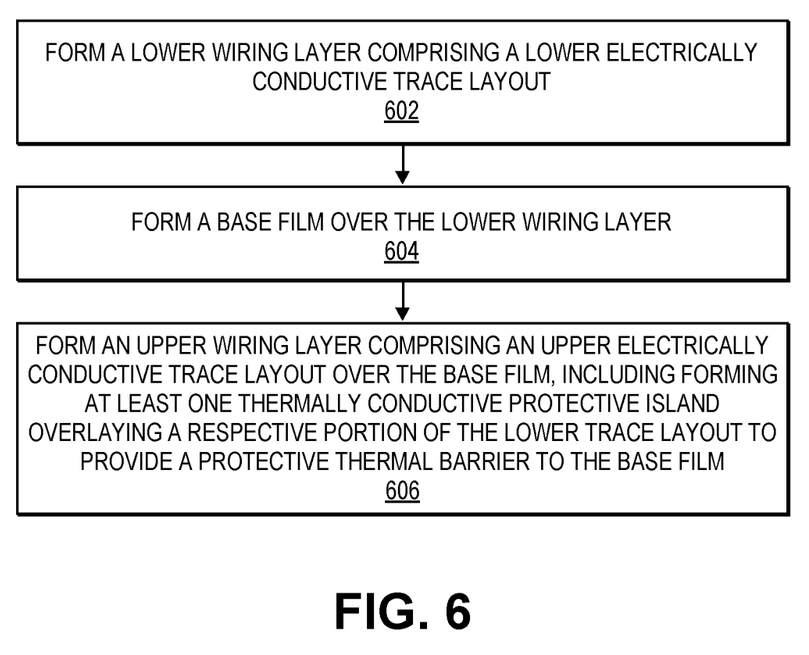
FIG. 6 is a flowchart illustrating a method for manufacturing a flexible printed circuit (FPC) laminate composition, according to an embodiment.

FIG. 6 is a flowchart illustrating a method for manufacturing a flexible printed circuit (FPC) laminate composition, according to an embodiment.

At block 602, a lower wiring layer comprising a lower electrically conductive trace layout is formed. For example, second wiring layer 366 (FIGS. 3B, 3C), 466 (FIG. 4) is formed with an electrically conductive trace layout, such as over the base stiffener 370 (FIG. 3C) and the second cover film 368 (FIG. 3C).

At block 604, a base film is formed over the lower wiring layer. For example, the base film 364 (FIG. 3C) is formed over the second wiring layer 366, 466.

At block 606, an upper wiring layer comprising an upper electrically conductive trace layout is formed over the base film, including forming at least one thermally conductive protective island overlaying a respective portion of the lower trace layout to provide a thermal barrier to the base film. For example, first wiring layer 362 (FIGS. 3B, 3C), 462 (FIG. 4) comprising an upper electrically conductive trace layout is formed over the base film 364, including forming at least one thermally conductive protective island 372 (FIGS. 3B, 4) overlaying a respective portion of the lower trace layout of the second wiring layer 366, 466, to provide a thermal barrier to the base film 364. According to an embodiment, the first wiring layer 362, 462 is electrically connected to the second wiring layer 366, 466 by a via 374 (FIG. 3C).

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable", or "flexible printed circuit" (FPC)). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A flexible printed circuit (FPC) comprising:
a plurality of fingers extending from a main portion, each finger comprising:
a first wiring layer comprising a first electrically conductive trace layout,
a second wiring layer comprising a second electrically conductive trace layout, and
a base film interposed between the first and second wiring layers;
wherein the first trace layout comprises at least one thermally conductive protective island overlaying a respective portion of the second trace layout to provide a protective thermal barrier to the base film.

2. The FPC of claim 1, wherein the at least one protective island is electrically connected to the second wiring layer by a via.

3. The FPC of claim 1, each finger further comprising:
a top narrow electrically conductive trace connecting a top electrical pad of the first wiring layer to an adjacent particular protective island; and
a bottom narrow electrically conductive trace connecting an opposing electrical pad of the first wiring layer to the adjacent particular protective island, thereby electrically connecting the top electrical pad with the bottom electrical pad.

4. The FPC of claim 1, further comprising:
a non-transparent cover film over the first wiring layer.

5. The FPC of claim 1, further comprising:
a white cover film over the first wiring layer.

6. The FPC of claim 1, further comprising:
a transparent cover film over the first wiring layer; and
a white second cover film over at least a portion of the transparent cover film of each finger.

7. A hard disk drive comprising the FPC of claim 1.

8. A method for manufacturing a flexible printed circuit (FPC) laminate composition,
the method comprising:
forming a lower wiring layer comprising a lower electrically conductive trace layout;
forming a base film over the lower wiring layer; and
forming an upper wiring layer comprising an upper electrically conductive trace layout over the base film, including forming at least one thermally conductive protective island overlaying a respective portion of the lower trace layout to provide a protective thermal barrier to the base film.

9. The method of claim 8, further comprising:
forming a via connecting the at least one protective island of the upper wiring layer to the lower wiring layer.

10. The method of claim 8, further comprising:
forming a top narrow electrically conductive trace connecting a top electrical pad of the upper wiring layer to an adjacent particular protective island; and
forming a bottom narrow electrically conductive trace connecting an opposing electrical pad of the upper wiring layer to the adjacent particular protective island, thereby electrically connecting the top electrical pad with the bottom electrical pad.

11. The method of claim 8, further comprising:
forming a non-transparent cover film over at least a portion of the upper wiring layer.

12. The method of claim 8, further comprising:
forming a white cover film over at least a portion of the upper wiring layer.

13. The method of claim 8, further comprising:
forming a transparent cover film over the upper wiring layer; and
forming a white second cover film over at least a portion of the transparent cover film.

14. An FPC produced according to the method of claim 8.

15. A hard disk drive (HDD) comprising:
a plurality of recording media rotatably mounted on a spindle;
a plurality of head sliders each housing a respective read-write transducer configured to read from and to write to at least one recording media of the plurality of recording media;
means for moving the plurality of head sliders to access portions of the at least one recording media; and
means for carrying signals from the plurality of head sliders to HDD electronics, the means for carrying comprising:
a plurality of fingers extending from a main portion, each finger comprising:
a first wiring layer comprising a first electrically conductive trace layout,
a second wiring layer comprising a second electrically conductive trace layout, and
a base film interposed between the first and second wiring layers;
wherein the first trace layout comprises at least one thermally conductive protective island overlaying a respective portion of the second trace layout to provide a protective thermal barrier to the base film.

16. The HDD of claim 15, wherein the at least one protective island is electrically connected to the second wiring layer by a via.

17. The HDD of claim 15, each finger further comprising:
a top electrically conductive trace connecting a top electrical pad of the first wiring layer to an adjacent particular protective island; and
a bottom electrically conductive trace connecting an opposing electrical pad of the first wiring layer to the adjacent particular protective island, thereby electrically connecting the top electrical pad with the bottom electrical pad.

18. The HDD of claim 15, the means for carrying further comprising:
a non-transparent cover film over the first wiring layer.

19. The HDD of claim 15, the means for carrying further comprising:
a white cover film over the first wiring layer.

20. The HDD of claim 15, the means for carrying further comprising:
a transparent cover film over the first wiring layer; and
a white second cover film over at least a portion of the transparent cover film of each finger.

* * * * *